(12) United States Patent
Tanizawa

(10) Patent No.: US 6,861,967 B2
(45) Date of Patent: Mar. 1, 2005

(54) NON-LINEARITY CORRECTING METHOD AND DEVICE FOR A/D CONVERSION OUTPUT DATA

(75) Inventor: Yukihiko Tanizawa, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/893,960

(22) Filed: Jul. 20, 2004

(65) Prior Publication Data

US 2005/0017884 A1 Jan. 27, 2005

(30) Foreign Application Priority Data

Jul. 22, 2003 (JP) ......................................... 2003-277578

(51) Int. Cl.[7] .................................................. F03M 1/06
(52) U.S. Cl. ........................................ 341/118; 341/120
(58) Field of Search ........................ 341/118, 119, 341/120, 121, 155, 157, 158

(56) References Cited

U.S. PATENT DOCUMENTS

| | | | |
|---|---|---|---|
| 4,721,944 A | | 1/1988 | Kiikuniya et al. |
| 4,975,700 A | * | 12/1990 | Tan et al. .................... 341/118 |
| 5,396,247 A | | 3/1995 | Watanabe et al. |
| 5,638,071 A | * | 6/1997 | Capofreddi et al. ......... 341/118 |
| 6,307,492 B1 | * | 10/2001 | Berranger et al. ........... 341/131 |
| 6,466,151 B2 | | 10/2002 | Nishii et al. |
| 6,535,152 B2 | * | 3/2003 | Lee .............................. 341/118 |
| 6,570,514 B1 | * | 5/2003 | Velazquez .................... 341/118 |
| 6,720,895 B2 | * | 4/2004 | Poulton et al. .............. 341/120 |
| 6,795,002 B2 | * | 9/2004 | Gupta .......................... 341/143 |

FOREIGN PATENT DOCUMENTS

| | | |
|---|---|---|
| JP | A-H10-145231 | 5/1998 |
| JP | A-2003-32108 | 1/2003 |

* cited by examiner

Primary Examiner—Michael Tokar
Assistant Examiner—Linh V Nguyen
(74) Attorney, Agent, or Firm—Posz & Bethards, PLC

(57) ABSTRACT

Predetermined reference voltages v1, v2 are A/D-converted to achieve corresponding digital data d0, d1, d2. Any reference digital values y1, y2 are set in advance so as to satisfy y1/y2=(v1−v0)/(v2−v0)=½. Furthermore, calculations of x1=d1−d0 and x2=d2−d0 are carried out to achieve x1, x2. A quadratic curve (quadratic function expression y=f(x)) passing a point D (x1, y1) and a point E (x2, y2) and the origin on the xy coordinate system is set as a linearly correcting expression. A shift value x achieved by subtracting d0 from data ds having non-linearity from the A/D converting circuit is corrected by the linearly correcting expression thus achieved to achieve a linearly corrected value y to ds.

8 Claims, 6 Drawing Sheets

NON-LINEARITY CORRECTING METHOD AND DEVICE FOR A/D CONVERSION OUTPUT DATA

CROSS REFERENCE TO RELATED APPLICATION

This application is based upon, claims the benefit of priority of, and incorporates by reference the contents of, Japanese Patent Application No. 03-277578 filed on Jul. 22, 2003.

FIELD OF THE INVENTION

The present invention relates to method and device for linearly correcting non-linearity of A/D conversion output data achieved by subjecting an analog signal to A/D conversion in an A/D converting circuit.

BACKGROUND OF THE INVENTION

There has been hitherto known an A/D converter which is equipped with a ring gate delay circuit comprising inverting circuits connected to one another in a ring form as a high-resolution A/D converting circuit having no analog circuit portion, and uses variation of an inverting operation time of each inverting circuit in accordance with a power supply voltage (for example, JP-A-5-259907).

An A/D converting circuit disclosed in the above publication (hereinafter referred to as "time A/D converting circuit") has been proposed by the applicant of this application, and the schematic construction thereof is shown in FIG. 8. As shown in FIG. 8, the time A/D converting circuit 100 comprises a pulse phase difference coding circuit 101 for encoding the phase difference of input pulses PA and PB, and a control circuit 102 for generating pulse signals PA and PB. The pulse phase difference coding circuit 101 comprises a ring gate delay circuit 110 which operates upon reception of the pulse signal PA from one input terminal and comprises one non-conjunction (NAND) circuit NAND as a starting inverting circuit and many inverters INV serving as inverting circuits which are linked to one another in a ring form, a counter 112 which is equipped at the front stage of the NAND circuit NAND in the ring gate delay circuit 110, and counting a round frequency of the pulse signal in the ring gate delay circuit 110 on the basis of the inversion frequency of the output level of the inverter INV to generate binary digital data, a latch circuit 114 for latching the digital data output from the counter 112, a pulse selector 116 for receiving the output of each of the inverting circuits (that is, the NAND circuit NAND and the inverters INV) constituting the ring gate delay circuit 110, extracting a pulse signal which is rounding through the ring gate delay circuit 110 from the output level thereof, and generating a signal representing the position of the pulse signal concerned, an encoder 118 for generating digital data corresponding to the output signal from the pulse selector 116, a signal processing circuit 119 which receives digital data from the latch circuit 114 as upper bits and digital data from the encoder 118 as lower bits to generate binary digital data d representing the phase difference between the pulse signals PA and PB, and a data output line 120 for outputting the digital data d generated in the signal processing circuit 119 to the external. The latch circuit 114 and the pulse selector 116 operate upon reception of the pulse signal PB output from the control circuit 102.

In the pulse phase difference coding circuit 101 thus constructed, when the pulse signal PA output from a control circuit 102 is set to High level, the ring gate delay circuit 110 starts the rounding operation of the pulse signal, and makes the pulse signal round while the pulse signal PA is set to High level. The round frequency is counted by the counter 112, and the count result is latched by the latch circuit 114 at the time point when the pulse signal PB output from the control circuit 102 is set to High level.

When the pulse signal PB output from the control circuit 102 is set to High level, the pulse selector 116 detects the round position of the pulse signal in the ring gate delay circuit 110, and the encoder 118 generates digital data corresponding to the round position. At this time, the signal processing circuit 119 generates binary digital data d corresponding to the time Tc from the rise-up of the pulse signal PA till the rise-up of the pulse signal PB on the basis of the digital data from the encoder 118 and the digital data latched in the latch circuit 114, and outputs the binary digital data d thus generated through a data output line 120 to the external.

Furthermore, an input terminal 101a for an analog signal (voltage signal) Vin to be A/D-converted is connected to a power supply line 110a for supplying power to each of the inverting circuits (that is, the NAND circuit NAND and the inverters INV) in the ring gate delay circuit 110, and the analog signal Vin is applied as a power supply voltage to each inverting circuit.

The inverting operation time (that is, the delay time of the pulse signal) in each inverting circuit is varied with the power supply voltage, so that the digital data d output from the data output line 120 is varied in accordance with the voltage level of the analog signal Vin. If the time Tc is fixed, the digital data corresponding to the analog signal Vin could be achieved. Therefore, in the time A/D converting circuit 100, the control circuit 102 is designed so that the time Tc from the rise-up of the pulse signal PA till the rise-up of the pulse signal PB is set to a fixed time at all times.

As a result, according to the time A/D converting circuit 100, the digital data d corresponding to the analog signal Vin is output from the pulse phase difference coding circuit 101, and also the A/D converting operation thereof is periodically carried out in conformity with the output period of the pulse signals PA, PB of the control circuit 102, so that the digital data d varies periodically in conformity with the variation of the analog signal Vin.

In the time A/D converting circuit 100 thus constructed, the characteristic of the digital data d with respect to the analog signal Vin has non-linearity as shown in FIG. 6. The reason why the A/D conversion output data (digital data d) does not linearly vary with respect to the variation of the analog signal Vin resides in that the delay time of each of the NAND circuit NAND and the inverters INV which constitute the ring gate delay circuit 110 does not vary in proportion to the variation of the power supply voltage.

Furthermore, in the time A/D conversion circuit 100 thus constructed, the analog signal Vin is also normally applied as a driving voltage to other circuits as well as the ring gate delay circuit 110, that is, the overall pulse phase difference coding circuit 101 to operate these circuits. Therefore, delay times caused by operations in the other circuits than the ring gate delay circuit 110 are varied by an effect of the analog signal Vin. These delay times do not vary in proportional to the variation of the analog signal Vin as the power supply voltage.

Therefore, in the time A/D converting circuit 100, the characteristic of the digital data d with respect to the analog signal Vin (hereinafter referred to as "A/D conversion output characteristic") has relatively large non-linearity. The time A/D converting circuit 100 having such non-linearity induces a problem in sensing equipment, etc. to which precise linearity is required, and it is difficult to use the A/D converting circuit described above in sensing equipment, measuring equipment, etc.

Therefore, JP-A-5-259907 discloses a method for linearly correcting non-linearity of the A/D conversion output characteristic. According to this linearly correcting method, ROM in which correcting data are stored is prepared, and correction values are allocated to the A/D conversion output data in one-to-one correspondence, thereby performing linear correction.

Furthermore, a correcting method of applying a fixed voltage different from the analog signal Vin to the other circuits than the ring gate delay circuit 110 to operate the other circuits, thereby reducing the non-linearity error (see JP-A-2002-118467) has been proposed for the power supply method of applying the analog signal Vin to the overall pulse phase difference coding circuit 101 as a driving voltage to operate the elements constituting the pulse phase difference coding circuit 101 as described above.

According to the correcting method proposed in JP-A-2002-118467, the non-linearity error caused by application of the analog signal Vin corresponding to A/D conversion target as a driving voltage to the other circuits than the ring gate delay circuit 110 is vanished, and thus the non-linearity error can be reduced to some extent. However, a non-linearity error caused by the fact that the pulse delay time in the ring gate delay circuit 110 is not proportional to the power supply voltage remains. Therefore, there is a problem that high-precision A/D conversion cannot be performed.

Furthermore, the linear correction method disclosed in JP-A-5-259907 can theoretically perform the linear correction on the non-linear error substantially perfectly. However, it is required to prepare for a large-capacity ROM and store vast amounts of correction values in the ROM. In addition, the A/D conversion output characteristic has a characteristic varying with temperature variation. That is, the delay time of each of the inverting circuits constituting the ring gate delay circuit 110 varies not only with the analog signal Vin as the power supply voltage, but also with temperature. Therefore, the non-linearity of the A/D conversion output characteristic is varied with temperature.

In order to take a countermeasure to the foregoing problem, there may be considered a method of separately equipping a temperature measuring circuit and also storing correction values dependent on temperature in a correcting ROM to thereby perform correction in consideration of the temperature characteristic. However, this method needs to prepare correction values for each of plural temperatures in an estimated temperature range, resulting in increase in scale of ROM and complication of the circuit construction. Therefore, the cost is increased and thus this method is not practical.

Furthermore, not only in the time A/D converting circuit 100, but also in a general A/D converting circuit having an analog circuit (for example, a double integral type), a non-linearity error is generally contained in the A/D conversion output data. In addition, a temperature drift in which an output value is varied by variation of the ambient temperature occurs. Therefore, even when the method using the correcting ROM as described above is applied as a method of correcting non-linearity of a general A/D converting circuit, the same problem (cost-up due to increase of scale of ROM, etc.) occurs and thus this method is not practical.

SUMMARY OF THE INVENTION

The present invention has been implemented in view of the foregoing problem, and has an object to provide method and device for linearly correcting non-linearity of A/D conversion output data at low cost without giving consideration to temperature variation.

In order to attain the above object, according to a first aspect of the present invention, in a method of correcting non-linearity of digital date output from an A/D converting circuit for converting an analog signal to digital data, reference analog signals Vi (i=0, 1, 2, . . . , n) (V0<V1<V2< . . . <Vn) of n+1 (n≧2) which can be A/D-converted in the A/D converting circuit are set, and reference digital values yj (j=1, 2, . . . , n) of n which have the following relation (1) between the respective reference analog signals Vi are set.

$$y1:y2: \ldots :yn = (V1-V0):(V2-V0): \ldots :(Vn-V0) \qquad (1)$$

By A/D-converting each of the reference analog signals Vi in the A/D converting circuit, the corresponding digital data di (i=0, 1, 2, . . . , n) are achieved, and each digital data di excluding d0 is converted to a shift value xj (j=1, 2, . . . , n) by the equation (2):

$$xj = di - d0 \, (i=j) \qquad (2)$$

Then, an n-order function expression y=f(x) representing an n-order curve passing through n coordinate points (xj, yj) and the origin on the xy coordinate is set as a linearly correcting expression.

When the linearly correcting expression is set, the digital data after the A/D conversion is carried out are corrected on the basis of the linearly correcting expression. Specifically, any analog signal (an analog signal as an A/D conversion target) is A/D-converted in the A/D converting circuit to achieve digital data d, and then d0 (a result of the A/D conversion of the reference analog signal V0) is subtracted from the digital data d thus achieved to achieve a shift value. The shift value thus achieved is substituted as a variable x into the linearly correcting expression to achieve a corrected digital value y in which the non-linearity of the digital data d is corrected.

The correction of the non-linearity of the A/D conversion output data (digital data) which is carried out by the above method will be described in detail with reference to FIGS. 6 and 7. For example, when the non-linearity of the A/D converting circuit having an A/D conversion output characteristic as shown in FIG. 6 is corrected, respective reference analog signals V0, V1, V2, . . . , Vn are actually A/D-converted in the A/D converting circuit to achieve digital data d0, d1, d2, . . . , dn. These digital data are dependent on an ambient environment (temperature, etc.) at that time. Furthermore, reference digital values y1, y2, . . . , yn are set so that the ratio thereof is coincident with the ratio of the differences of the respective reference analog signals (excluding V0) V1, V2, . . . , Vn from V0 (that is, the right side of the expression (1)) (see FIG. 7).

Then, d0 is subtracted from each of the digital values d1, d2, . . . , dn by the expression (2), whereby the digital values are converted to corresponding shift values x1, x2, . . . , xn. Furthermore, an n-order function expression y=f(x) representing an n-order curve passing through the respective coordinates (x1, y1), (x2, y2), . . . , (xn, yn) and the origin is set as a linearly correcting expression on an xy coordinate system in which the shift values x1, x2, . . . , xn are set on the abscissa axis (x-axis) and the respective reference digital values y1, y2, . . . , yn are set on the ordinate axis (y-axis) as shown in FIG. 7.

The n-order curve represented by the linear correction y=f(x) is achieved by approximating the actual A/D conversion output characteristic shown in FIG. 6 with an n-order curve passing through each point (Vi, di), shifting a point A(V0, d0) on the n-order curve to the origin and then exchanging the abscissa axis and the ordinate axis to each other. The shape of the approximate curve (n-order curve) of the A/D conversion output characteristic of FIG. 6 is similar to that of the n-order curve representing the linearly correcting expression of FIG. 7.

That is, each digital data di corresponding to the A/D conversion result of each analog signal Vi has non-linearity which is not proportional to each analog signal Vi as shown in FIG. 6. However, the linearly correcting expression y=f(x) shown in FIG. 7 serves to convert the analog signal Vi (accurately, the shift value) having the non-linearity to each reference digital value yi, and also each reference digital value yi and each analog signal Vi have the relation represented by the expression (1). Therefore, the digital data d (containing a non-linearity error) achieved by A/D-converting any analog signal V as shown in FIG. 6 is shifted by d0 to achieve a shift value x (=d−d0), and then the shift value x thus achieved is subjected to correction operation using the linearly correcting expression y=f(x), thereby achieving a corrected digital value y in which non-linearity is corrected (linearly corrected) as shown in FIG. 7.

As a method of setting an n-order function expression passing through coordinate points (xj, yj) of n and the origin, the n-order function expression may be derived by a well-known method such as a least-squares method, a Lagrangian interpolation formula method or the like, and the n-order function expression may be set as the linear correcting expression.

Accordingly, according to the non-linearity correcting method of the first aspect of the present invention, reference analog signals Vi of n+1 are actually A/D converted in the A/D converting circuit, the linearly correcting expression is set on the basis of the conversion result, and the digital data are corrected on the basis of the linearly correcting expression thus set. Therefore, the linear correction can be performed with high precision by using a proper linearly correcting expression corresponding to instantaneous temperature variation irrespective of ambient environmental variation such as temperature variation or the like. In addition, the correction is carried out on the basis of an operation using a linearly correcting expression merely, and thus the correction can be implemented in low cost as compared with the conventional method of storing correction values in correcting ROM in advance.

Here, the number of the reference analog signals may be set to any value insofar as it is equal to three or more. The A/D conversion output characteristic of the time A/D converting circuit 100 shown in FIG. 8 can be well approximated by a quadratic curve, for example. In the case of a double integration type such as a general A/D converting circuit, the A/D conversion output characteristic thereof can be frequently well approximately by a quadratic curve.

Therefore, according to a second aspect of the present invention, the linearly correcting expression may be a quadratic function expression, for example. That is, n of the first aspect of the presents invention is set to 2. In this case, reference analog signals are V0, V1 and V2 (totally three signals), and reference digital values yj are y1, y2 (totally, two digital values). Shift values x1, x2 are calculated from the equation (2) on the basis of digital data d0, d1, d2 achieved by A/D-converting each reference analog signal Vi, and a quadratic curve (quadratic function expression) passing coordinate points (x1, y1), (x2, y2) and the origin is set.

When the linearly correcting expression is a quadratic function expression as described above, the operation processing, the circuit construction, etc. to implement the linear correction can be simplified with keeping the precision of the linear correction, and high-precision correction which is not effected by variation of ambient temperature can be performed in low cost.

According to a third aspect of the present invention, a non-linearity correcting device equipped to the A/D converting circuit to implement the non-linearity correcting method of the first aspect of the present invention is equipped with a reference analog signal generating unit for generating each reference analog signal vi, a reference digital value setting unit for setting each reference digital value yj, a reference signal input unit for successively inputting each reference analog signal Vi generated in the reference analog signal generating unit to the A/D converting circuit, a correction expression setting unit for setting a linearly correcting expression on the basis of each digital data di corresponding to each reference analog signal Vi input to the A/D converting circuit by the reference signal input unit and each reference digital value yj, and a correcting operation unit for correcting digital data d corresponding to any analog signal input from the external to a corrected digital value y according to the linearly correcting expression set by the correction expression setting unit.

More specifically, the correction expression setting unit converts each digital data di by the equation (2) (shifts the digital data di by only d0), and sets the linearly correcting expression on the basis of each shift value xj and each reference digital value yj after the conversion. Furthermore, more specifically, when the correcting operation unit carries out linear correction on the digital data d corresponding to the analog signal as an A/D conversion target input from the external, the correcting operation unit substitutes into the linearly correcting expression a shift value achieved by subtracting d0 from the digital data d to achieve the corrected digital value y.

Accordingly, according to the non-linearity correcting device thus constructed, the A/D conversion output data (digital data) can be linearly corrected by using the non-linearity correcting method of the first aspect, and thus the same effect as the first aspect can be achieved.

Here, the reference analog signal generating unit may be implemented by various constructions insofar as each reference analog signal Vi can be surely generated. For example, according to a fourth aspect of the present invention, the reference analog signal generating unit may be constructed by a constant voltage generating unit for generating a reference constant voltage Vr which is equal to or larger than the maximum value Vn of the reference analog signal Vi generated, and a voltage dividing unit for dividing the reference constant voltage Vr to generate each reference analog signal Vi, and also the voltage dividing unit may be designed so that the ratio of the respective reference analog signals Vi (V0:V1:V2: . . . :Vn) is fixed irrespective of variation of ambient temperature.

That is, for example when the voltage dividing unit is constructed by plural resistors, the ratio (V0:V1:V2: . . . :Vn) of the reference analog signals Vi may be varied in accordance with temperature because the resistance values of the resistors would vary if the temperature varies. Even when the above ratio is varied, the ratio of the reference digital values yj (that is, the left side of the equation (1)) is invariable, so that the linearly correcting expression is not conformed with the actual temperature at that time, and thus it is inaccurate.

Therefore, the voltage diving unit is required to be constructed so that the above ratio is fixed even when the ambient temperature varies. In order to satisfy the above requirement, when the voltage dividing unit is constructed in a resistor-based voltage dividing style, the respective resistors for dividing the reference constant voltage Vr into respective reference analog signals are designed to have the same resistance temperature coefficient.

If the reference analog signal generating unit is constructed as described above, the reference analog signals Vi can be generated with a simple construction of merely dividing the reference constant voltage Vr. In addition, since the ratio (V0:V1:V2: . . . :Vn) of the reference analog signals Vi is fixed even when the ambient temperature varies, high-precision correction can be performed irrespective of the ambient temperature at all times.

In the non-linear correcting device of the present invention (third and fourth aspects), a quadratic linearly correcting expression may be set on the basis of three reference analog signals to perform linear correction as in the case of a fifth aspect of the present invention.

That is, according to a non-linear correcting device of a fifth aspect of the present invention, the reference analog signal generating unit generates three reference analog signals V0, V1, V2 as reference analog signals Vi, two reference digital values y1, y2 are set in the reference digital value setting unit and the correction expression setting unit sets a linearly correcting expression represented by the following equation (3) on the basis of the digital data d0, d1, d2 corresponding to the reference analog signals V0, V1, V2 and the reference digital values y1, y2.

$$y=\{(x-x2) \cdot y1/x1+(x1-x) \cdot y2/x2\} \cdot x/(x1-x2) \quad (3)$$

The above equation (3) is achieved by a well-known general mathematical expression calculation for deriving a quadratic function expression passing coordinate points (x1, y1), (x2, y2) and the origin, and thus the description of a deriving process of this equation (3) is omitted. According to the non-linear correcting device thus constructed, the non-linear correcting method of the second aspect can be implemented, and the same effect as the second aspect can be achieved.

In addition to the above notation system, various notation systems may be adopted for the linearly correcting expression (3) by using a normal expression modifying method like a notation system of dividing the linearly correcting expression into terms containing variable x and the other constant terms. That is, the notation system for the linearly correcting expression (3) is not limited to a specific notation system insofar as the calculation corresponding to the equation (3) is carried out as a result.

The non-linear correcting device of the present invention (third to fifth aspects) is applicable to any construction/type of A/D converting circuit to carry out linear correction on non-linearity of A/D conversion output data. However, as described above, the time A/D converting circuit 100 shown in FIG. 8 is more remarkable in non-linearity than other general A/D converting circuits because of its specific construction. Therefore, the non-linearity correcting device of any one of the third to fifth aspects may be constructed like a sixth aspect of the present invention.

That is, a non-linear correcting device according to a sixth aspect of the present invention is equipped to correct non-linearity of an A/D converting circuit comprising: a pulse rounding circuit including plural inverting circuits which invert input signals thereto and joined to one another in a ring-shape, the inverting operation time of each inverting circuit being varied by a power supply voltage, one of the inverting circuits being constructed as a starting inverting circuit whose inverting operation can be controlled from the external, and the pulse rounding circuit rounding a pulse signal in connection with start of the operation of the starting inverting circuit; an analog signal input terminal which is connected to a power supply line of each inverting circuit in the pulse rounding circuit and applies the analog signal as the power supply voltage of each inverting circuit; a counter for counting a round frequency of the pulse signal in the pulse round circuit and outputting the count result as binary digital data; a control unit for actuating the starting inverting circuit to start the round operation of the pulse rounding circuit; and a data output line for outputting the binary digital data from the counter as a part of an A/D conversion result.

According to the non-linear correcting device which is constructed to correct the non-linearity of the A/D conversion circuit, non-linearity can be corrected with high precision for an A/D converting circuit having relatively large (remarkable) non-linearity, and the effect Is more remarkable.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

A preferred embodiment according to the present invention will be described hereunder with reference to the accompanying drawings.

Figure 1:
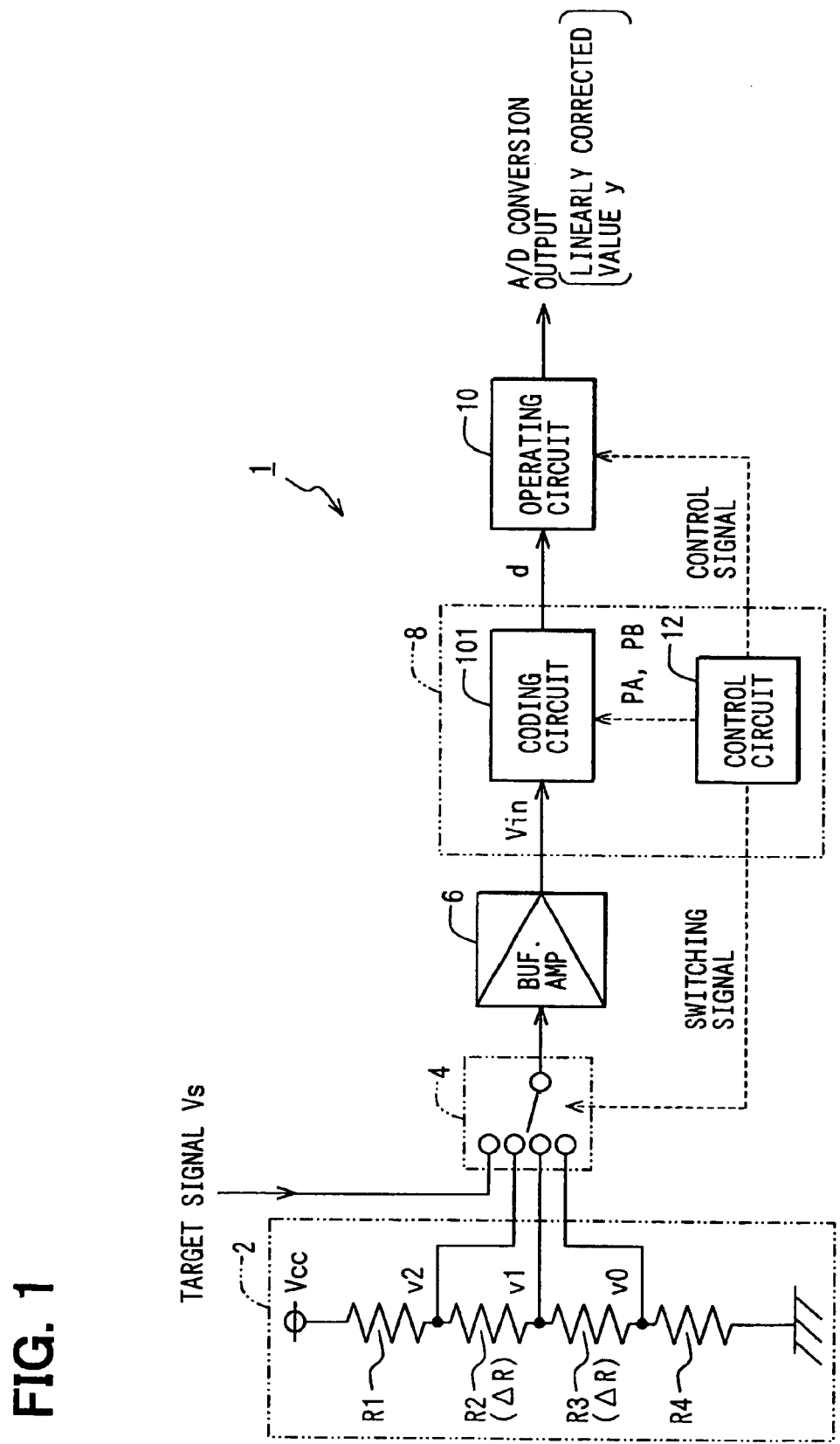
FIG. 1 is a diagram showing the construction of an A/D converting device according to an embodiment of the present invention.

FIG. 1 is a diagram showing the construction of an A/D converting device according to an embodiment of the present invention. The A/D converting device 1 of this embodiment serves to A/D-convert a signal (a signal Vs to be measured; hereinafter referred to as "measurement target signal Vs") from each semiconductor sensor element (not shown) for detecting a physical quantity, such as a semiconductor type infrared sensor, a semiconductor type pressure sensor or the like, and it is preferably fabricated in one signal processing IC (not shown).

As shown in FIG. 1, it comprises a reference voltage generating circuit 2 for generating three reference voltages v0, v1, v2, an analog multiplexer 4 for selecting and outputting any one of the reference voltages v0, v1, v2 and the measurement target signal Vs from the semiconductor sensor element, a buffer amplifier (amplification is 1) 6 for impedance conversion to set the time A/D converting circuit 8 side to high impedance with respect to the analog multiplexer 4, the time A/D converting circuit 8 for A/D-converting an input voltage Vin (any one of v0, v1, v2, vs) input from the analog multiplexer 4 through the buffer amplifier 6, and an operating circuit 10 for linearly correcting non-linearity (non-linearity error) possessed by digital data d from the time A/D converting circuit 8 and outputting linear correction values y after the correction as A/D conversion output data from the A/D converting device 1 to the external.

The reference voltage generating circuit 2 comprises four resistors R1, R2, R3 and R4, which are connected in series, and it is designed so that a divided voltage of a constant voltage Vcc can be taken out from each connection point between the respective resistors by applying the constant voltage Vcc to one end of the resistor R1.

That is, the connection point voltage between the resistors R1 and R2 is equal to v2, the connection point voltage between the resistors R2 and R3 is equal to v1, and the connection point voltage between the resistors R3 and R4 is equal to v0. These three voltages v0 v1, v2 are input to the analog multiplexer 4 as a reference voltage to set a correction expression as described later. The fixed voltage Vcc is generated by a constant voltage circuit (constant voltage generating unit) (not shown).

The resistors R2 and R3 are equal to each other in resistance temperature coefficient, and thus the variation rate $\Delta R$ of a resistance value with variation of ambient temperature is equal therebetween. Accordingly, (v1−v0): (v2−v0) is set to a fixed ratio irrespective of the variation of the ambient temperature at all times. In addition, the resistance values of the resistors R2 and R3 are set to the same value in this embodiment, so that the ratio is set to 1:2.

The analog multiplexer 4 selects any one of the three reference voltages v0, v1, v2 and the measurement target signal Vs in accordance with a SW switching signal from a control circuit 12, and it comprises plural analog switches. The time A/D converting circuit 8 comprises a pulse phase difference coding circuit 101 for encoding the phase difference between pulse signals PA and PB from the control circuit 12, and the control circuit 12 for generating the pulse signals PA and PB and outputting an SW switching signal to the analog multiplexer 4 and various control signals to control the operation of the operating circuit 10 described later.

Figure 8:
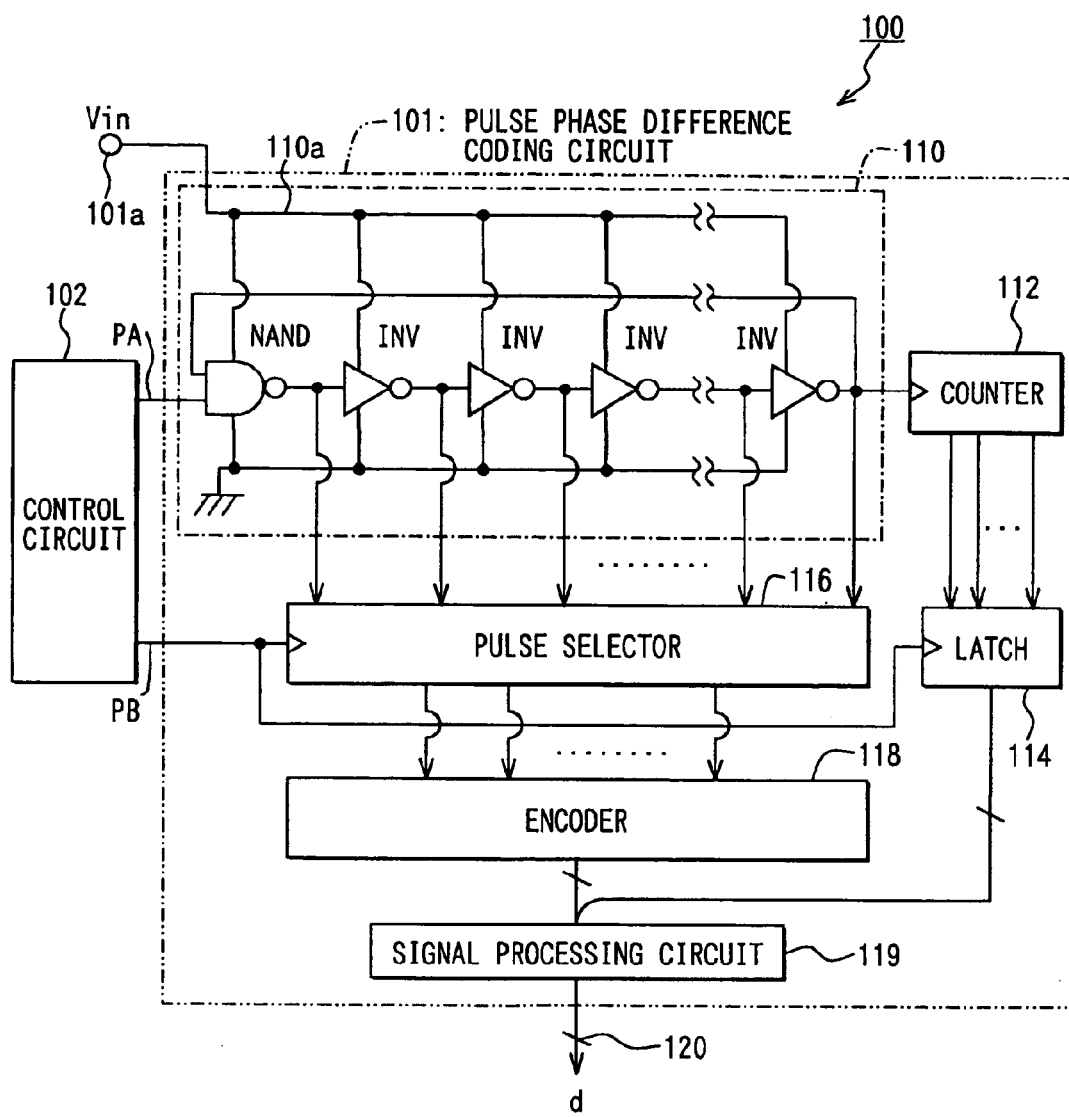
FIG. 8 is a diagram showing the construction of a related art A/D converting circuit (time A/D converting circuit) using a ring gate delay circuit.

The pulse phase difference coding circuit 101 is similar to the pulse phase difference coding circuit 101 constituting the time A/D converting circuit 100 described with reference to FIG. 8. Therefore, the detailed description of the pulse phase difference coding circuit 101 is omitted. The pulse signals PA and PB from the control circuit 12 are similar to the pulse signals PA and PB output from the control circuit 102 constituting the time A/D converting circuit 100 of FIG. 8.

Figure 2:
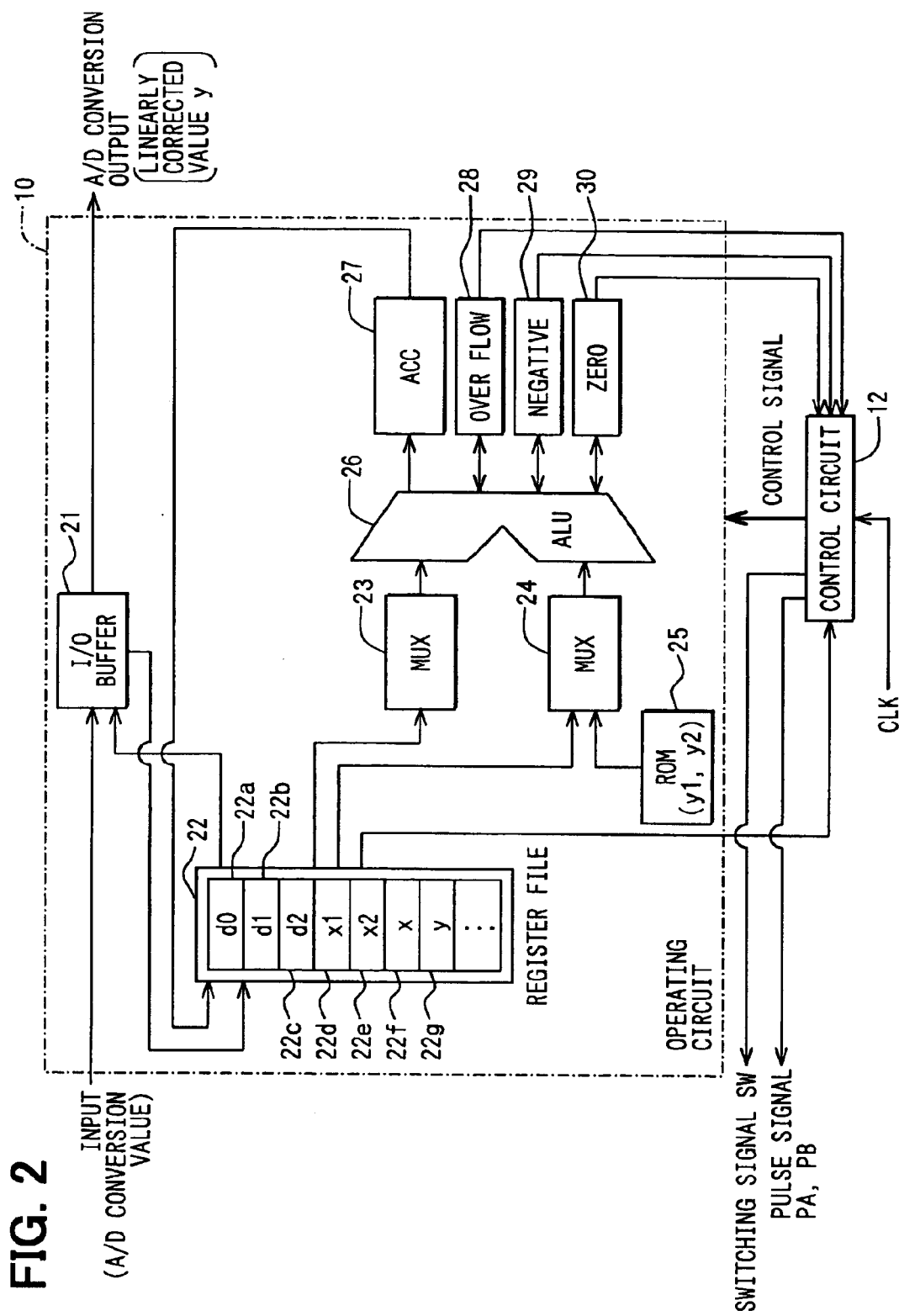
FIG. 2 is a block diagram showing the construction of an operating circuit 10.

Next, the internal construction of the operating circuit 10 will be described with reference to FIG. 2. As shown in FIG. 2, the operating circuit 10 comprises an input/output buffer 21 for receiving an A/D conversion value (digital data) d from the time A/D converting circuit 8 and outputting a linear correction value y after correcting operation to the outside, a general-purpose register group 22 for storing various kinds of digital data from the time A/D converting circuit 8 and various kinds of data occurring during the operating process in the operating circuit 10, ROM 25 in which reference digital values y1, y2 required to set a linearly correcting expression, other various kinds of control programs, etc. are stored, a multiplexer 23 for selecting data in the general-purpose register group 22 and outputting the data thus selected to an arithmetic and logic unit (hereinafter referred to as "ALU") 26, a multiplexer 24 for selecting any one of the data in the general-purpose register 22 and the reference digital values y1, y2 in ROM 25 and outputting the selected data or value to ALU 26, ALU 26 for carrying out predetermined operating processing on the data from the respective multiplexers 23 and 24, an accumulator (hereinafter referred to as "ACC") 27 in which an operation result of ALU 26 is temporarily stored, a carry flag 28 for setting a flag when carry occurs in the operation result of ALU 26, a negative number flag 29 for setting a flag when the operation result of ALU 26 is equal to a negative number, and a zero flag 30 for setting a flag when the operation result of ALU 26 is equal to zero. These elements are basically operated according to various control signals from the control circuit 12.

The control circuit 12 has a counter for receiving an operating clock pulse CLK from the external and counting the clock pulse CLK thus received (not shown), and controls the operation of each part in the operating circuit 10 on the basis of the count value and also on the basis of the three flags 28, 29 and 30 input from ALU 26 and each register value in the general-purpose register group 22, as occasion demands.

Figure 4:
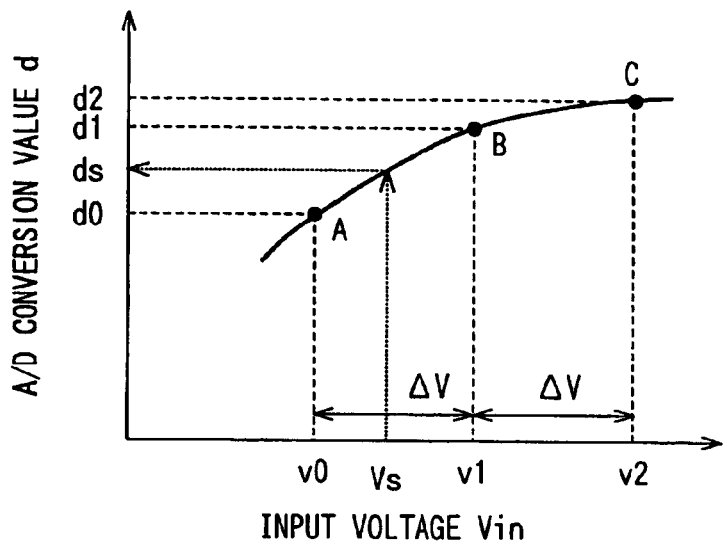
FIG. 4 is a graph showing the relation between an input voltage and an A/D conversion value in a time A/D converting circuit 8.

With respect to the time A/D converting circuit 8 constituting the A/D converting device 1 thus constructed, the A/D conversion output characteristic thereof has non-linearity as shown in FIG. 4. In this embodiment, since (v1−v0) is equal to (v2−v1), the interval between d0 and d1 and the interval between d1 and d2 would be equal to each other if the A/D conversion output characteristic has an ideal linear characteristic. However, since the A/D conversion output of the time A/D converting circuit 8 of this embodiment has non-linearity as described above, the above intervals are not equal to each other as is also apparent from FIG. 4.

Therefore, the correcting operation of linearly correcting the A/D conversion output data having this non-linearity is carried out in the operating circuit 10, and then the corrected data are output as a final A/D conversion result to the external. The operation of linearly correcting the A/D conversion result of the measurement target signal Vs by the time A/D converting circuit 8 in the A/D converting device 1 of this embodiment will be described.

In order to carry out the linear correction on digital data from the time A/D converting circuit 8, it is required to set a linearly correcting expression for the linear correction in advance. Therefore, before A/D conversion of the measurement target signal Vs is carried out, the linearly correcting expression is set on the basis of the digital data d0, d1, d2 achieved by A/D-converting the reference voltages v0, v1, v2.

Specifically, the respective reference voltages v0, v1, v2 are successively input to the time A/D converting circuit 8 to achieve corresponding digital data d0, d1, d2. Reference digital values y1, y2 required to set the linearly correcting expression are stored in ROM 25 in advance. Any digital values may be set as the reference digital values y1, y2 insofar as they satisfy the relation represented by the following equation (4):

$$y1/y2=(v1-v0)/(v2-v0) \quad (4)$$

Here, in this embodiment, the reference voltages v1 and v2 are set so that the right side of the equation (4) is equal to ½, and thus y1/y2 is equal to ½. In other words, y1=(y2−y1)=ΔD as shown on the abscissa axis of the graph of FIG. 5.

In this embodiment, the minimum value v0 of the three reference voltages is set to zero. This is because the time A/D converting circuit 8 uses the ring gate delay circuit 110 comprising a logic circuit and thus it does not operate when the input voltage Vin (that is, the power supply voltage of each inverting circuit) is equal to zero. Furthermore, in this embodiment, the buffer amplifier 6 is used merely for impedance conversion and thus the signal amplification thereof is set to 1. However, the buffer amplifier 6 may be designed to carry out amplification with predetermined amplification degree in addition to impedance conversion. In this case, the input voltage Vin to the time A/D converting circuit 8 corresponds to a signal achieved by amplifying a signal from the analog multiplexer 4 with the amplification degree.

Figure 5:
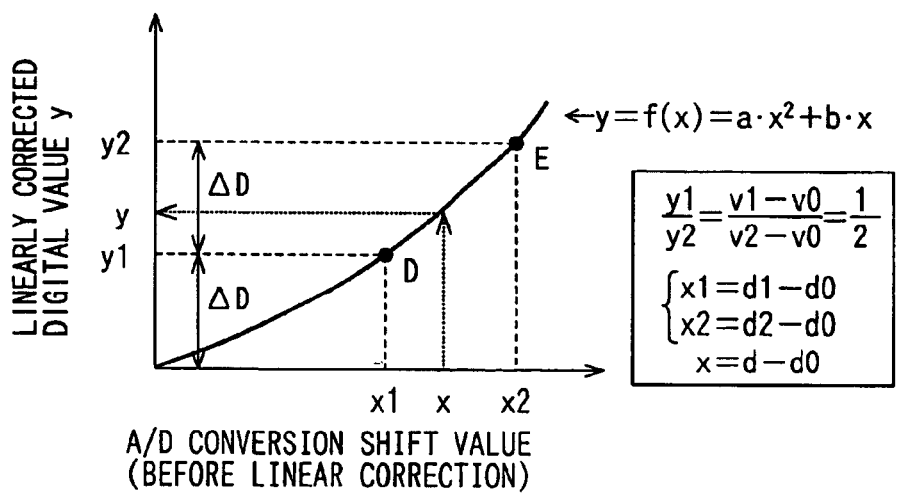
FIG. 5 is a graph showing the relation between an A/D conversion shift value before linear correction in the operating circuit 10 and a linear correction result.
Figure 6:
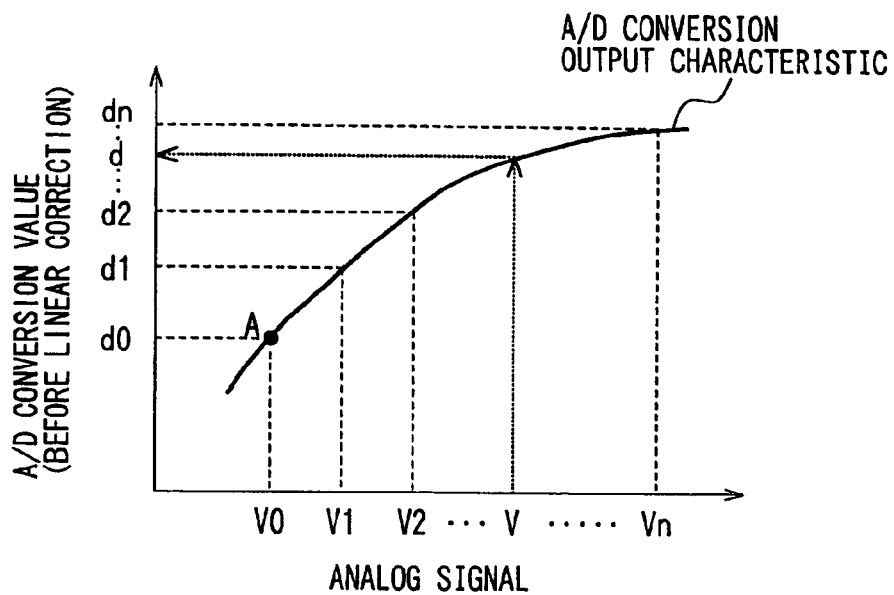
FIG. 6 is a graph showing the relation between an analog signal and an A/D conversion value in the A/D converting circuit.
Figure 7:
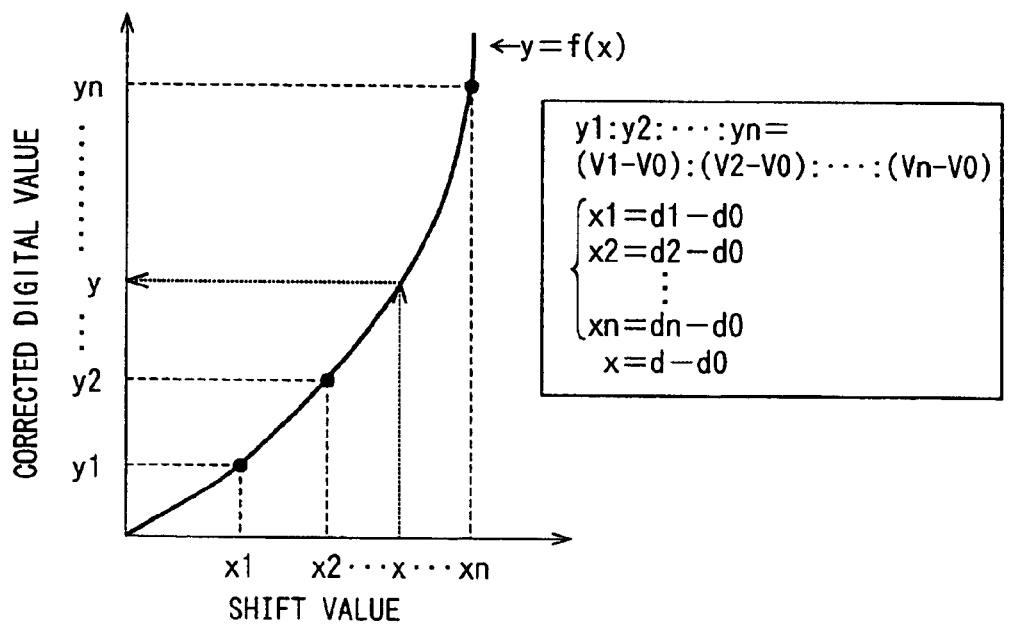
FIG. 7 is a graph showing the relation between a shift value before linear correction and a linear correction result.

With respect to the digital data d0, d1, d2 thus achieved, values achieved by subtracting d0 from d1 and d2 are set as A/D conversion shift values x1, x2, respectively. That is, x1=d1−d0, and x2=d2−d0. A quadratic curve (quadratic function expression y=f(x)) passing through coordinate points D(x1, y1), E(x2, y2) and the origin is set as a linearly correcting expression on the xy coordinate system in which the A/D conversion shift values are set on the abscissa axis (x-axis) and the reference digital values y1, y2 are set on the ordinate axis (y-axis) as shown in FIG. 5.

The linearly correcting expression is set to a quadratic function as described above because the A/D conversion output characteristic of FIG. 4 can be approximated well by a quadratic curve. That is, the quadratic curve representing the linearly correcting expression shown in FIG. 5 is achieved by approximating the actual A/D conversion output characteristic of FIG. 4 with a quadratic curve passing through three coordinate points A(v0, d0), B(v1, d1), C(v2, d2), shifting the point A(v0, d0) on the quadratic curve to the origin and then exchanging the ordinate axis and the abscissa axis to each other. The shape of the quadratic curve of FIG. 4 is similar to the shape of the quadratic curve representing the linearly correcting expression of FIG. 5.

The linearly correcting expression y=f(x) can be easily derived by the following method. That is, since the linearly correcting expression is a quadratic function expression passing the origin, the following relation of the equation (5) is satisfied wherein a, b represent constants and $y=a \cdot x^2 + b \cdot x$.

$$y1=a \cdot (x1)^2 + b \cdot x1$$

$$y2=a \cdot (x2)^2 + b \cdot x2 \quad (5)$$

The constants a, b are achieved by solving the simultaneous equations of (5). As a result, the linearly correcting expression is represented by the following equation (6):

$$y=\{(x-x2) \cdot y1/x1 + (x1-x) \cdot y2/x2\} \cdot x/(x1-x2) \quad (6)$$

When the linearly correcting expression is achieved as described above, the measurement target signal Vs is A/D-converted by the time A/D converting circuit 8 to achieve digital data ds (see FIG. 4), and a value achieved by subtracting d0 from ds is substituted as an A/D conversion shift value x into the above linearly correcting expression to achieve a linear correction value y (see FIG. 5).

The setting of a linearly correcting expression for a linear correction calculation as described above and the linear correction calculation based on the linearly correcting expression are actually performed by controlling the time A/D converting circuit 8, the analog multiplexer 4 and the operating circuit 10 by the control circuit 12, and this control operation will be described with reference to FIG. 3.

Figure 3:
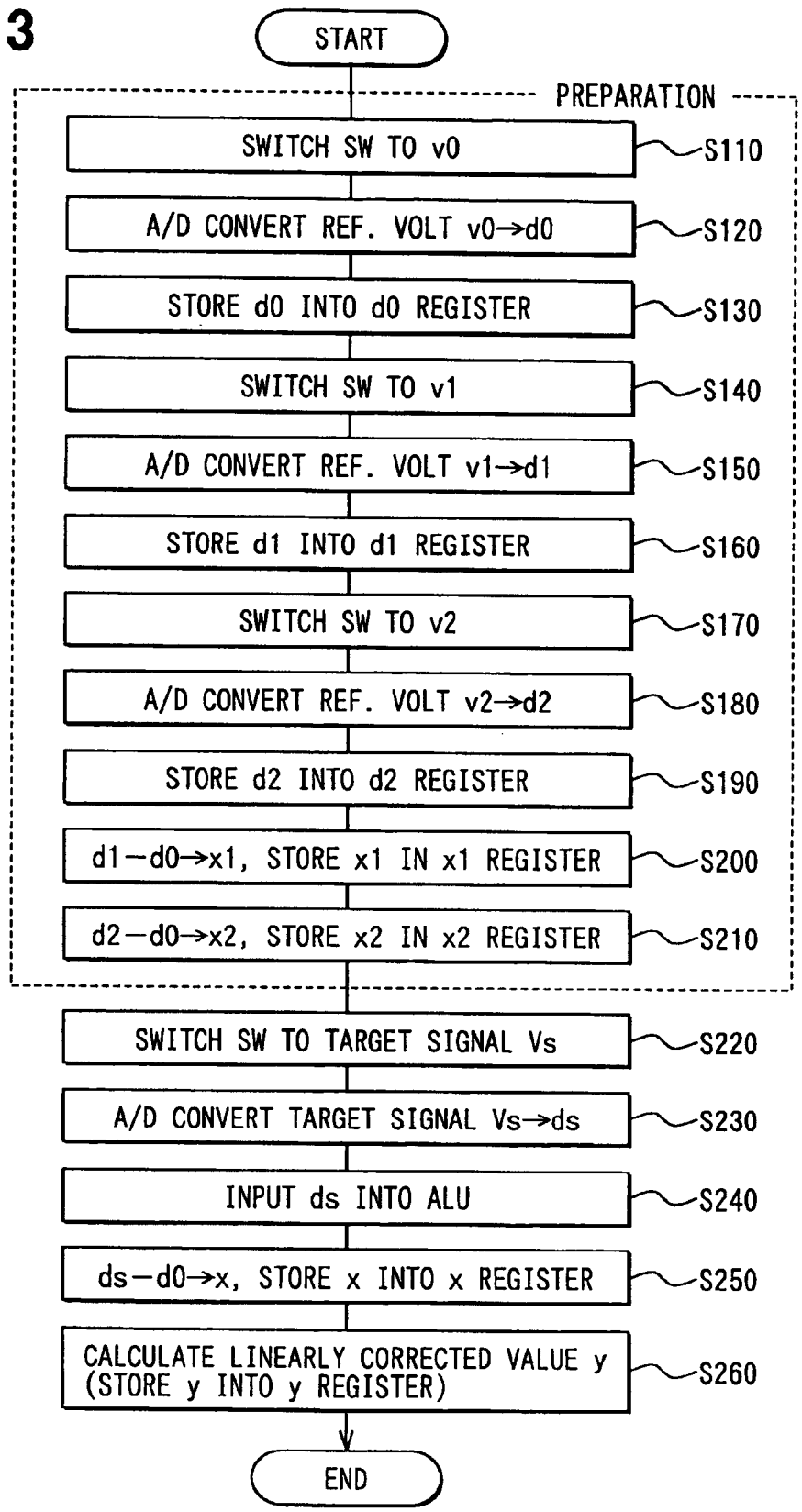
FIG. 3 is a flowchart showing linear correction control processing of the embodiment.

FIG. 3 is a flowchart showing the linear correction control processing executed by the control circuit 12, and this control processing is repetitively carried out at a predetermined period. The operation may be implemented in a hardware mode in the control circuit 12 or according to a program written in ROM 25.

When this processing is started, the analog multiplexer (indicated by "SW" in the flowchart of FIG. 3) 4 is switched to the reference voltage v0 side on the basis of the SW switching signal in step (hereinafter abbreviated as "S") 110, whereby the reference voltage v0 is input as the input voltage Vin of the time A/D converting circuit 8 through the buffer amplifier 6. In S120, the time A/D converting circuit 8 is operated to A/D-convert the reference voltage v0, and in subsequent S130, the digital data d0 corresponding to the A/D conversion result is stored in a d0 register 22a of the general-purpose register group 22.

The same processing as v0 is carried out on the other two reference voltages v1, v2. That is, in S140, the analog multiplexer 4 is switched to the reference voltage v1 side on the basis of the SW switching signal, and the reference voltage v1 is input as the input voltage Vin of the time A/D converting circuit 8 through the buffer amplifier 6. In subsequent S150, the time A/D converting circuit 8 is operated to A/D-convert the reference voltage v1, and the digital data d1 corresponding to the A/D conversion result is stored in a d1 register 22b of the general-purpose register group 22 in S160.

Then, the processing goes to S170 to switch the analog multiplexer 4 to the reference voltage v2 side on the basis of the SW switching signal, and input the reference voltage v2 through the buffer amplifier 6 as the input voltage Vin of the time A/D converting circuit 8. In subsequent S180, the time A/D converting circuit 8 is operated to A/D-convert the reference voltage v2, and in S190 the digital data d2 corresponding to the A/D conversion result is stored in a d2 register 22c of the general-purpose group 22.

In S200, (d1−d0) is calculated, and the calculation result x1 is stored in an x1 register 22d. Likewise, (d2−d0) is calculated in S210, and the calculation result x2 is stored in an x2 register 22e. These calculations are carried out by ALU 26, and the results are stored in the respective registers through ACC 27.

The reference digital values y1, y2 are stored in ROM 25 as described above. Therefore, through the processing of S210 and the steps preceding to S210, all of the constants x1, x2, y1, y2 in the linearly correcting expression of the equation (6) are determined. That is, the processing from S110 to S210 in the linear correction control processing of FIG. 3 is pre-processing for setting the linearly correcting expression (6).

The pre-processing may be carried out every time the measurement target signal Vs is A/D-converted, and this enables non-linearity to be corrected with a linearly correcting expression reflecting an ambient environment (temperature or the like) at that time, so that the correction can be performed with extremely high precision. However, in such a case that temperature does not vary drastically, the pre-processing may be carried out at a suitable time interval.

Specifically, it may be carried out at a fixed period by using a timer or the like, or every time the measurement target signal Vs is taken in at a predetermined number of times. Furthermore, a temperature sensor is separately equipped to measure the ambient temperature, and a linearly correcting expression is derived again when temperature is varied by a predetermined value or more as compared with temperature when a previous linearly correcting expression is derived.

When the linear correcting expression is set as described above, the analog multiplexer 4 is switched to the measurement target signal Vs side in S220 to input the measurement target signal Vs through the buffer amplifier 6 as the input voltage Vin of the time A/D converting circuit 8. In subsequent S230, the time A/D converting circuit 8 is operated to A/D-convert the measurement target signal Vs, and the digital data ds corresponding to the A/D conversion result is taken into ALU 26 in S240. A calculation of x=ds−d0 is carried out in S250, and the calculation result x is stored in an x register 22f.

In S260, x stored in the x register 22f is substituted as a variable x into the linearly correcting expression (6) and the calculation is carried out to achieve a linear correction value y. Specifically, the calculation is carried out by an operation processing circuit constructed in a hardware style in the control circuit 12 or according to an operation program based on the linearly correcting expression (6) stored in ROM 25 while suitably taking into ALU 26 the respective values in the general-purpose group 22 and the reference digital values y1, y2 in ROM 25. The linear correction value y thus achieved is stored in the y register 22g, and also output as a final A/D conversion result after the correction through the input/output buffer 21 to the external.

As described above, according to the A/D converting device 1 of this embodiment, the A/D conversion is actually conducted on the reference voltages v0, v1, v2 in the time A/D converting circuit 8, the linearly correcting expression is set on the basis of the A/D conversion result concerned and then the digital data of the measurement target signal Vs (A/D conversion result) is corrected on the basis of the linearly correcting expression. Therefore, the linear correction can be performed with high precision by a suitable linearly correcting expression conformed with temperature variation at that time irrespective of variation of an ambient environment such as temperature variation or the like. In addition, the correction is carried out on the basis of the calculation using a linearly correcting expression merely, and thus the correction can be implemented at a lower cost in comparison with the conventional method in which correction values are stored in correcting ROM.

Furthermore, according to this embodiment, an A/D conversion output characteristic is approximated by a quadratic curve, and a linearly correcting expression is represented by a quadratic function. Therefore, as compared with a case where a linearly correcting expression is represented by a function of three or higher order, the construction of the operating circuit 10 for implementing linear correction, the control processing of the control circuit 12, etc. can be more simplified with keeping the precision of the linear correction, and high-precision correction which is not affected by variation of ambient temperature can be implemented in low cost.

Still furthermore, the resistors R2 and R3 constituting the reference voltage generating circuit 2 are designed to have the same resistance temperature coefficient, and the ratio of (v1−v0):(v2−v0) is not varied even when temperature varies, so that high-precision correction can be performed irrespective of ambient temperature at all times.

Here, the corresponding relation between each constituent element of this embodiment and each constituent element of the present invention will be made clear. In this embodiment, the constant voltage Vcc corresponds to the reference constant voltage Vr of the present invention, the reference voltages v0, v1, v2 correspond to the reference analog signal Vi of the present invention, the linear correction value y from the operating circuit 10 corresponds to the corrected digital value y of the present invention, the reference voltage generating circuit 2 corresponds to the reference analog signal generating unit of the present invention, the resistors R1, R2, R3, R4 corresponds to the voltage dividing unit of the present invention, ROM 25 corresponds to the reference digital value setting unit of the present invention, the reference signal input unit of the present invention is constructed by the control circuit 12 and the analog multiplexer 4, and the correction expression setting unit and the correcting operation unit of the present invention are constructed by the control circuit 12 and the operating circuit 10.

Furthermore, the ring gate delay circuit 110 corresponds to the pulse round circuit of the present invention, the input terminal 2a corresponds to the analog signal input terminal of the present invention, and the control circuit 12 corresponds to the control unit of the present invention.

Furthermore, in the linear correction control processing of FIG. 3, all the processing of S110, S140 and S170 correspond to the processing executed by the reference signal input unit of the present invention, all the processing of S130, S160 and S190 to S210 correspond to the processing executed by the correction expression setting unit of the present invention, and the processing of S240 to S260 corresponds to the processing executed by the correcting operation unit of the present invention.

The present invention is not limited to the above embodiment, and various modifications may be made without departing from the subject matter of the present invention.

For example, in this embodiment, the three reference voltages v0, v1, v2 are set, and the A/D conversion output characteristic is approximated to a quadratic curve. However, it may be approximated to not only a quadratic curve, but also a three or higher order curve to achieve a similar linear expression for linear correction. However, the A/D conversion output characteristic of the time A/D converting circuit 8 can be well approximated by a quadratic curve, and it has no practical problem. Therefore, the quadratic-curve approximation is actually sufficient.

Furthermore, in the above embodiment, the time A/D converting circuit 8 using the ring gate delay circuit 110 is used, and thus it is not operated when the input voltage Vin is equal to zero as described above. Therefore, the reference voltage is set to a value larger than zero (in other words, set to a value at which the ring gate delay circuit 110 can be operated). However, the input voltage Vin may be set to zero for a general A/D converting circuit using an analog circuit.

Accordingly, when linear correction is carried out on an A/D converting circuit to which zero can be input as the input voltage Vin, the reference voltage v0 may be set to zero. That is, reference analog signals Vi of n (i=1, 2, ..., n; n≧2)(0<V1<V2<, ..., <Vn) which can be A/D-converted in the A/D converting circuit are set, and reference digital values yi of n (i=1, 2, ..., n) having the relation represented by the following equation (7) between the respective reference analog signals Vi:

$$Y1:y2:, \ldots, :yn=V1:V2:, \ldots, :Vn \tag{7}$$

Each of the reference analog signals Vi is A/D-converted in the A/D converting circuit to achieve corresponding digital data di (i=1, 2, . . . , n), and an n-order function expression y=f(x) representing an n-order curve passing through the coordinate points (di, yi) of n and the origin on the xy coordinate system is set as a linearly correcting expression. When the linearly correcting expression is achieved as described above, any analog signal (A/D-conversion target signal) is A/D-converted in the A/D converting circuit to achieve digital data d, and the digital data d thus achieved is directly substituted as a variable x into the linear correcting expression, thereby achieving a corrected digital value y in which non-linearity of the digital data d is corrected.

Furthermore, in the above embodiment, the time A/D converting circuit 8 using the ring gate delay circuit 110 as the A/D converting circuit is described as an example. However, it is needless to say that the present invention is not limited to the time A/D converting circuit 8. For example, a generally well-known A/D converting circuit such as a double integration type may be applied.

Furthermore, in the above embodiment, the A/D converting device 1 is installed in a signal processing IC, a measurement target signal Vs from a semiconductor sensor element is A/D-converted, non-linearity of the A/D conversion output data is corrected, and then the data thus corrected are output. It is needless to say that the present invention is not limited to application to the signal processing IC as described above.

Still furthermore, most of semiconductor type sensors which are designed so that a measurement target signal from a semiconductor sensor element is A/D-converted are originally equipped with an operating circuit (four rules operating function) because some correction other than the non-linearity correction of the present invention (for example, correction of temperature characteristic or dispersion of a semiconductor sensor element itself) is normally carried out on an A/D conversion value. Therefore, when the present invention is applied to such a semiconductor type sensor, the correcting calculation for linear correction can be carried out by using the originally-mounted correcting operating circuit of sensor characteristic and adding a required minimum function (circuit, etc.).

What is claimed is:

1. A method of correcting non-linearity of digital data output from an A/D converting circuit for converting an analog signal to digital data, the method comprising:

setting reference analog signals Vi (i=0, 1, 2, . . . , n) (V0<V1<V2< . . . <Vn) of n+1 (n≧2) which can be A/D-converted in the A/D converting circuit, and setting reference digital values yj (j=1, 2, . . . , n) of n which have the following relation (1) between the respective reference analog signals Vi:

$$y1:y2: \ldots :yn=(V1-V0):(V2-V0): \ldots :(Vn-V0) \quad (1)$$

A/D-converting each of the reference analog signals Vi in the A/D converting circuit to achieve corresponding digital data di (i=0, 1, 2, . . . , n), and converting each digital data di excluding d0 to a shift value xj (j=1, 2, . . . , n) by the following equation (2):

$$xj=di-d0(i=j) \quad (2)$$

setting as a linearly correcting expression an n-order function expression y=f(x) representing an n-order curve passing through coordinate points xj, yj of n and the origin on the xy coordinate; and achieving digital data d by A/D-converting any analog signal in the A/D converting circuit, subtracting d0 from the digital data d to achieve a shift value, and then substituting the shift value as a variable x into the linearly correcting expression to achieve a corrected digital value y in which non-linearity of the digital data d is corrected.

2. The non-linearity correcting method of the A/D conversion output data according to claim 1, wherein n is equal to 2.

3. A non-linearity correcting device equipped to an A/D converting circuit for performing the non-linearity correcting method of claim 1, the device comprising:

a reference analog signal generating unit for generating each of the reference analog signals Vi;

a reference digital value setting unit for setting each of the reference digital values yj;

a reference signal input unit for successively inputting each of the reference analog signals Vi to the A/D converting circuit;

a correction expression setting unit for setting a linearly correcting expression on the basis of each of the digital data di corresponding to each of the reference analog signals Vi input to the A/D converting circuit by the reference signal input unit and each of the reference digital values yj; and a correcting operation unit for correcting digital data d corresponding to any analog signal input from the external to a corrected digital value y according to the linearly correcting expression set by the correction expression setting unit.

4. The non-linearity correcting device according to claim 3, wherein the reference analog signal generating unit comprises:

a constant voltage generating unit for generating a reference constant voltage Vr which is equal to or larger than the maximum value Vn of the reference analog signals Vi; and a voltage dividing unit for dividing the reference constant voltage Vr to generate each reference analog signal Vi, and the voltage dividing unit is designed so that the ratio of the respective reference analog signals Vi (V0:V1:V2: . . . :Vn) is fixed irrespective of variation of ambient temperature.

5. The non-linearity correcting device according to claim 4, wherein the reference analog signal generating unit generates three reference analog signals (V0, V1, V2) as reference analog signals Vi, two reference digital values (y1, y2) are set in the reference digital value setting unit, and the correction expression setting unit sets a linearly correcting expression represented by the following equation (3) on the basis of the digital data (d0, d1, d2) corresponding to the three reference analog signals (V0, V1, V2) and the reference digital values (y1, y2)

$$y=\{(x-x2)\cdot y1/x1+(x1-x)\cdot y2/x2\}\cdot x/(x1-x2) \quad (3)$$

6. The non-linear correcting device according to claim 5, wherein the A/D converting circuit comprises:

a pulse rounding circuit including plural inverting circuits which invert input signals thereto and joined to one another in a ring-shape, the inverting operation time of each inverting circuit being varied by a power supply voltage, one of the inverting circuits being constructed as a starting inverting circuit whose inverting operation can be controlled from the external, and the pulse rounding circuit rounding a pulse signal in connection with start of the operation of the starting inverting circuit;

an analog signal input terminal connected to a power supply line of each inverting circuit in the pulse rounding circuit and applies the analog signal as the power supply voltage of each inverting circuit;

a counter for counting a round frequency of the pulse signal in the pulse round circuit and outputting the count result as binary digital data;

a control unit for actuating the starting inverting circuit to start the round operation of the pulse rounding circuit; and a data output line for outputting the binary digital data from the counter as a part of an A/D conversion result.

7. The non-linearity correcting device according to claim 3, wherein the reference analog signal generating unit generates three reference analog signals (V0, V1, V2) as reference analog signals Vi, two reference digital values (y1, y2) are set in the reference digital value setting unit, and the correction expression setting unit sets a linearly correcting expression represented by the following equation (3) on the basis of the digital data (d0, d1, d2) corresponding to the three reference analog signals (V0, V1, V2) and the reference digital values (y1, y2).

$$y=\{(x-x2)\cdot y1/x1+(x1-x)\cdot y2/x2\}\cdot x/(x1-x2) \quad (3)$$

8. The non-linear correcting device according to claim 3, wherein the A/D converting circuit comprises:

a pulse rounding circuit including plural inverting circuits which invert input signals thereto and joined to one another in a ring-shape, the inverting operation time of each inverting circuit being varied by a power supply voltage, one of the inverting circuits being constructed as a starting inverting circuit whose inverting operation can be controlled from the external, and the pulse rounding circuit rounding a pulse signal in connection with start of the operation of the starting inverting circuit;

an analog signal input terminal connected to a power supply line of each inverting circuit in the pulse rounding circuit and applies the analog signal as the power supply voltage of each inverting circuit;

a counter for counting a round frequency of the pulse signal in the pulse round circuit and outputting the count result as binary digital data;

a control unit for actuating the starting inverting circuit to start the round operation of the pulse rounding circuit; and a data output line for outputting the binary digital data from the counter as a part of an A/D conversion result.

* * * * *